United States Patent [19]

Branson et al.

[11] Patent Number: 5,508,644
[45] Date of Patent: Apr. 16, 1996

[54] SENSE AMPLIFIER FOR DIFFERENTIAL VOLTAGE DETECTION WITH LOW INPUT CAPACITANCE

[75] Inventors: Brian D. Branson; Victor Shadan; Lew Chua-Eoan, all of Austin, Tex.

[73] Assignee: Motorola, Inc., Schaumburg, Ill.

[21] Appl. No.: 314,474

[22] Filed: Sep. 28, 1994

[51] Int. Cl.[6] .................................................. G01R 19/00
[52] U.S. Cl. .......................... 327/57; 327/51; 365/189.05
[58] Field of Search .................................. 327/50, 51, 52, 327/53, 54, 55, 56, 57; 365/189.01, 189.02, 189.03, 189.04, 189.05, 189.06, 189.08, 205, 206, 207, 208, 230.01

[56] References Cited

U.S. PATENT DOCUMENTS

| | | | |
|---|---|---|---|
| 4,169,233 | 9/1979 | Harasztl | 327/57 |
| 4,932,002 | 6/1990 | Houston | 327/51 |
| 4,962,324 | 10/1990 | Park | 327/52 |
| 4,973,864 | 11/1990 | Nogami | 327/55 |
| 5,068,831 | 11/1991 | Hoshi et al. | 327/51 |
| 5,083,295 | 1/1992 | Lammerts et al. | 327/51 |
| 5,130,580 | 7/1992 | Min et al. | 327/52 |
| 5,132,930 | 7/1992 | Furutani et al. | 327/51 |
| 5,309,047 | 5/1994 | Tiede et al. | 327/52 |

Primary Examiner—Timothy P. Callahan
Assistant Examiner—Kenneth B. Wells
Attorney, Agent, or Firm—Lee E. Chastain

[57] ABSTRACT

A sense amplifier (10) has a pair of cross-coupled latches (12, 14, 16, 18) connected between a first voltage supply ($V_{DD}$) and the sources of two transistors (20, 22). The gates of the two transistors receive a voltage differential to be sensed. The drains of the two transistors are coupled to a second voltage supply ($V_{SS}$) through an enabling transistor (24). The resulting sense amplifier is fast, small, and relatively simple to construct.

4 Claims, 3 Drawing Sheets

CLOCK

ADDRESS

WL

LE

DATA

PRECHARGE 500,8644

SENSE AMPLIFIER FOR DIFFERENTIAL VOLTAGE DETECTION WITH LOW INPUT CAPACITANCE

FIELD OF THE INVENTION

The present invention generally relates to digital electronics and more particularly to sensing circuits for a memory system.

BACKGROUND OF THE INVENTION

Advances in semiconductor products are continually requiring smaller and faster devices. Smaller device size allows more functions to be integrated into a single device. Faster devices result in higher throughput for a given system. Unfortunately, these goals are often mutually exclusive given standard circuit designs.

Sense amplifiers are devices particularly driven by technology to smaller and faster implementations. Sense amplifiers detect small voltage differences between two input signals and generate an output representative of which of the two inputs is greater. Sense amplifiers are widely used in memory systems to determine what logic level a memory cell represents given the two output voltages from the cell. Sense amplifiers are also difficult to design both smaller and faster.

SUMMARY OF THE INVENTION

In accordance with the present invention, there is disclosed a sense amplifier which substantially eliminates disadvantages of known sense amplifiers. The disclosed invention claims a novel sense amplifier and memory system incorporating the sense amplifier.

The disclosed sense amplifier comprises a pair of cross-coupled latches to which two transistors are coupled in parallel between the two latches and a voltage supply. The gates of the two transistors receive the input voltage differential. The sense amplifier also includes an equalization circuit coupled to the output nodes and a weak enabling transistor.

The disclose memory system includes the novel sense amplifier, a plurality of bit cells, and a decode circuit.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
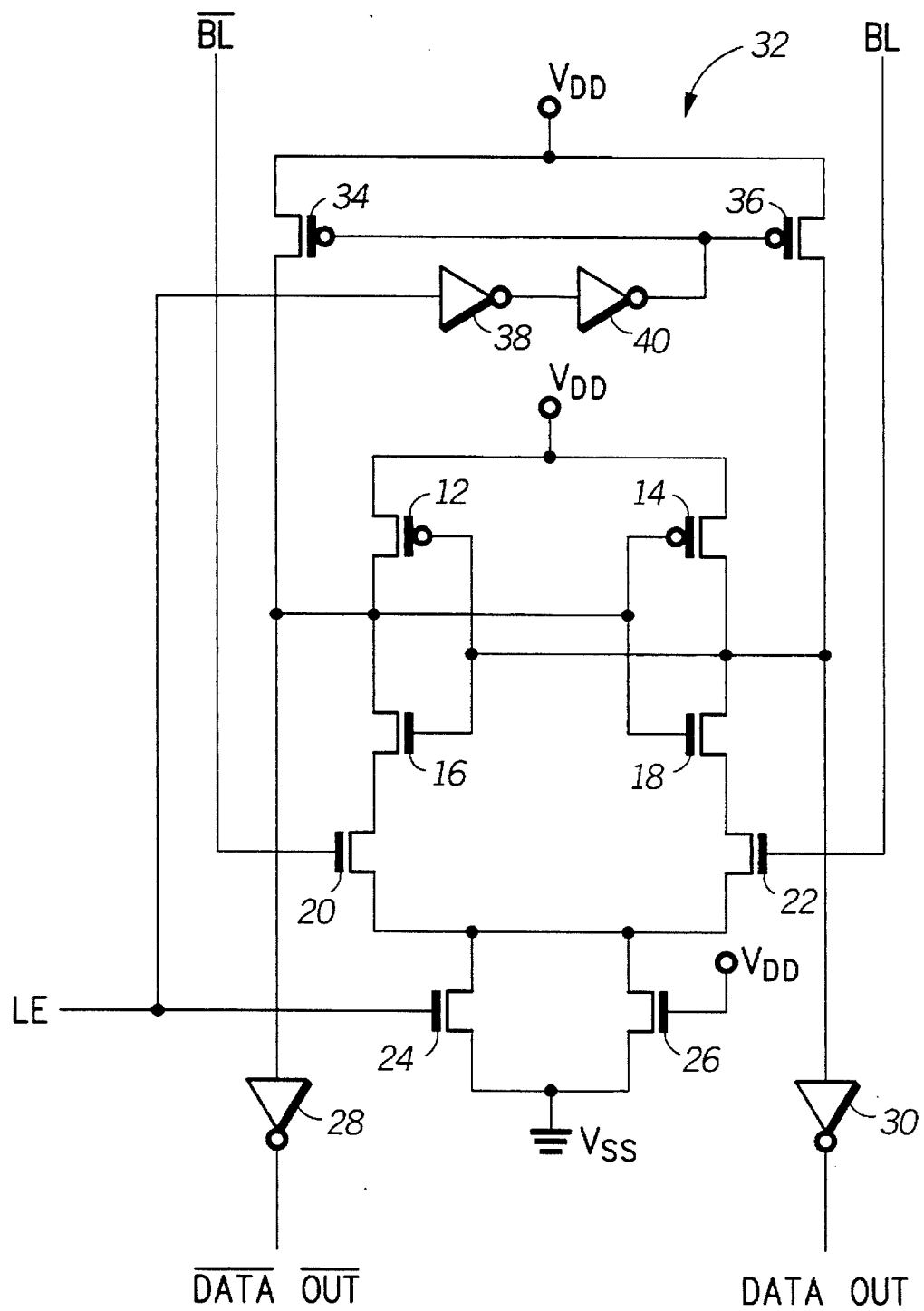
FIG. 1 depicts a schematic diagram of a sense amplifier constructed in accordance with the present invention.

FIG. 1 depicts a schematic diagram of a sense amplifier 10 (hereinafter simply "sense amp 10") constructed in accordance with the present invention. Sense amp 10 is designed to sense a small voltage differential generated across the two terminals of a memory bit-cell (depicted in FIG. 2 as bit-cell 44 and output a logic level voltage in response to which of the two terminals is positive with respect to the other. The novel design of sense amp 10 reduces the capacitive loading on the associated memory bit cells, couples no charge from the memory bit cell to sense amp 10, and allows for fast equalization of the bitline voltage during and after a read or write operation. Therefore, sense amp 10 is suitable for use in high speed applications. In addition, sense amp 10 does not require complicated timing control signals or the circuits that generate these signals. Sense amp 10 is therefore a relatively small circuit.

Continuing with FIG. 1, a p-channel transistor 12, a p-channel transistor 14, an n-channel transistor 16, and an n-channel transistor 18 form a latch. A first current electrode of each of transistors 12 and 14 receive a first voltage supply, labeled VDD. A second current electrode of transistors 12 and 14 are coupled to a first current electrode of transistors 16 and 18, respectively. The control electrodes of transistor 12 and transistor 16 are coupled to both the second current electrode of transistor 14 and to the first current electrode of transistor 18. Similarly, the control electrodes of transistor 14 and transistor 18 are coupled to both the second current electrode of transistor 12 and to the first current electrode of transistor 16. A second current electrode of transistor 16 is coupled to the first current electrode of an n-channel transistor 20. A control electrode of transistor 20 receives a logical complement of an input voltage, $\overline{BL}$. A second current electrode of transistor 18 is coupled to the first current electrode of an n-channel transistor 22. A control electrode of transistor 22 receives the input voltage, BL. Both a second current electrode of transistor 20 and a second current electrode of transistor 22 are coupled to a first current electrode of an n-channel transistor 24 and to a first current electrode of an n-channel transistor 26. A second current electrode of transistor 24 receives a second voltage supply, $V_{SS}$. A second current electrode of transistor 26 also receives the second voltage supply, $V_{SS}$. A control electrode of transistor 24 receives a control signal latch enable (labeled "LE"). A control electrode of transistor 26 receives the first voltage supply, $V_{DD}$. Transistor 26 is approximately one-fortieth the size of transistors 12, 14, 16, 18, 20, 22, and 24.

The second current electrode of transistor 12 and the first current electrode of transistor 16 are also connected to an input of an inverter 28. An output of inverter 28 generates the logic level signal $\overline{DATA\ OUT}$. The second current electrode of transistor 14 and the first current electrode of transistor 18 are also connected to an input of an inverter 30. An output of inverter 30 generates the logic level signal DATA OUT. (In certain embodiments, either the output of inverter 28 or the output of inverter 30 need not be used.)

An equalization circuit 32 is coupled to the inputs of inverters 28 and 30. Equalization circuit 32 has a p-channel transistor 34, a p-channel transistor 36, an inverter 38 and an inverter 40. A first current electrode of transistor 34 and a first current electrode of transistor 36 receive the first voltage supply, $V_{DD}$. A second current electrode of transistor 34 is connected to the input of inverter 28, the second current electrode of transistor 12, the first current electrode of transistor 16, and to the control electrodes of transistors 14 and 18. A second current electrode of transistor 36 is connected to the input of inverter 30, the second current electrode of transistor 14, the first current electrode of transistor 18, and to the control electrodes of transistors 12 and 16. An input of inverter 38 receives the control signal LE. An output of inverter 38 is connected to an input of inverter 40. An output of inverter 40 is connected to a control electrode of transistor 34 and to a control electrode of transistor 36.

The operation of sense amp 10 is characterized by the two phases of the control signal LE.

During the first phase, LE is low. Here, equalization circuit 32 precharges the inputs of inverters 28 and 30 to a high logic state. Simultaneously, transistor 26 sinks a small current from transistors 20 and 22. This sinking step begins the second phase described below. In certain embodiments, it may be desirable to omit transistor 26.

During the second phase, LE is high. Here, transistor 24 is placed into a conducting state. One of transistors 20 or 22 will be placed into more of a conducting state than will the other. This same transistor will cause the one of transistors 16 and 18 to which it is coupled to sink more current than the other. The one of transistors 16 and 18 so sinking more current will drive the input of its inverter to a low voltage level. Meanwhile, the p-channel transistor 12 or 14 coupled to the other transistor will pull-up the input of the other inverter to $V_{DD}$. For instance, if the input voltage BL is higher than the input voltage $\overline{BL}$, then transistor 22 and transistor 18 will sink more current from the input of inverter 30 than transistor 20 and transistor 16 will sink from the input of inverter 28. Transistor 18 will sink current from the input of inverter 30 while transistor 12 sources current to the input of inverter 28.

Figure 2:
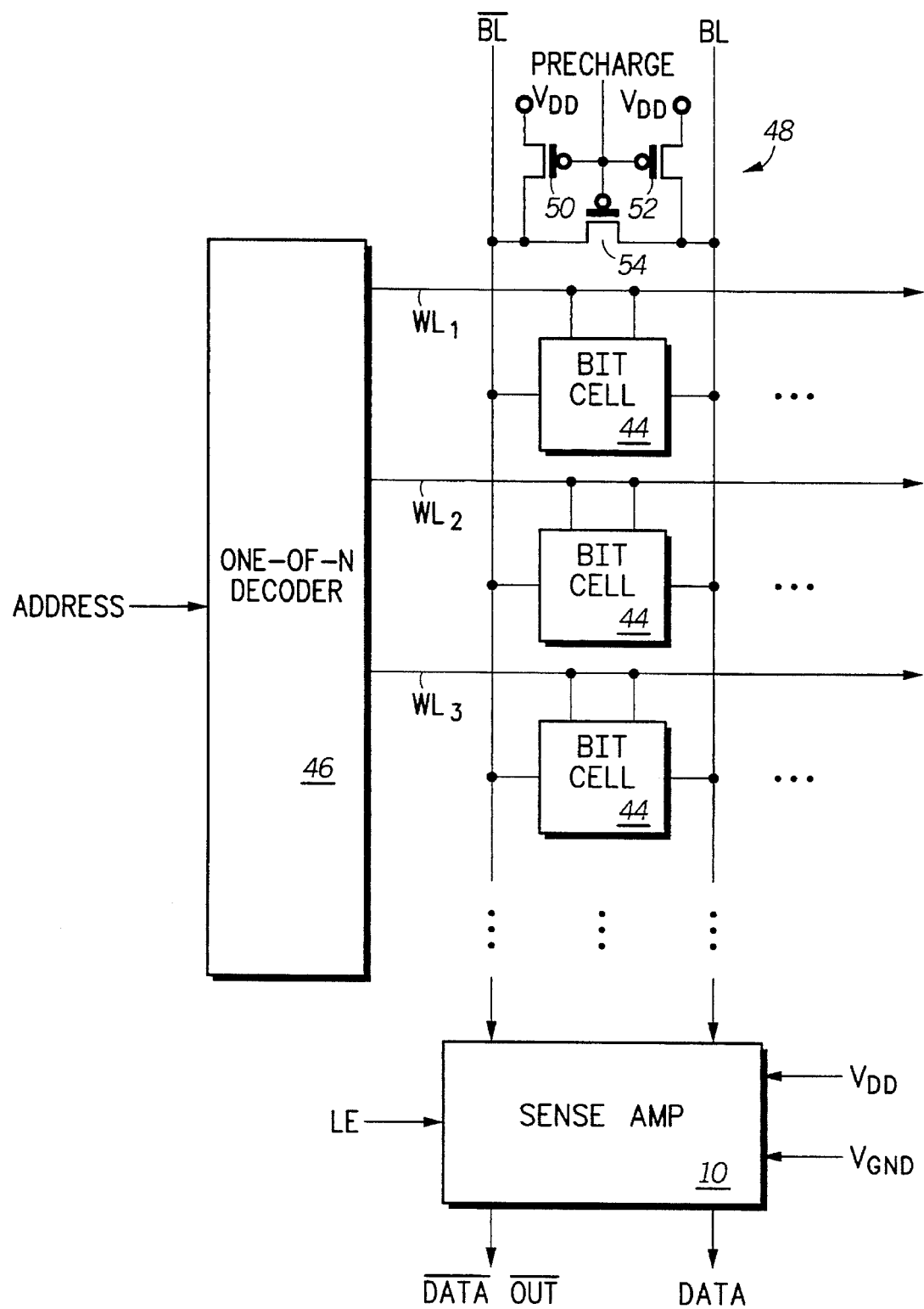
FIG. 2 depicts a block diagram of a memory system incorporating the sense amplifier depicted in FIG. 1.

FIG. 2 depicts a block diagram of a memory system 42 incorporating sense amp 10 depicted in FIG. 1. In memory system 42, sense amp 10 monitors the outputs from a column of N memory bit cells 44, where N is an integer. Various types of bit cell circuits may be used in memory system 42. Memory system 42 typically is made up of many columns of bit cells and sense amps forming an M-column by N-row array of memory bits (as indicated by the ellipses), where M is also an integer. The contents of a particular bit cell in a particular column is read from or written to (1) by supplying an address that, when decoded, contains the particular bit cell and (2) by either enabling sense amp 10 or driving the appropriate voltage level onto the bitlines, respectively. A particular address may select one bit cell, four bit cells, eight bit cells, sixteen bit cells, etc. depending upon the design of memory system 42.

A received memory address is decoded by a one-of-N decoder 46 which generates a suitable select signal on the appropriate write line (labeled $WL_1$, $WL_2$, etc.). Once enabled, a selected bit cell couples its internal storage cell to a bitline and a bitline bar (labeled BL and $\overline{BL}$, respectively). The voltage levels present on the bitlines are representative of the logic level stored by the selected bit cell.

A bitline precharge circuit 48 precharges the bitline and bitline bar to increase the sense speed of sense amp 10. Bitline precharge circuit 48 has a p-channel transistor 50, a p-channel transistor 52, and a p-channel transistor 54. A control electrode of transistor 50 receives a control signal PRECHARGE. A first current electrode of transistor 50 receives the first voltage supply, $V_{DD}$. A second current electrode of transistor 50 is coupled to the bitline bar. A control electrode of transistor 52 receives the control signal PRECHARGE. A first current electrode of transistor 52 receives the first voltage supply, $V_{DD}$. A second current electrode of transistor 52 is coupled to the bitline. A control electrode of transistor 54 receives the control signal PRECHARGE. A first current electrode of transistor 54 is coupled to the bitline bar. A second current electrode of transistor 54 is coupled to the bitline.

Figure 3:
FIG. 3 depicts a timing diagram illustrating the operation of the memory system depicted in FIG. 2.
Figure 3:
Figure 3:
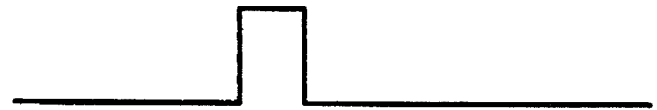
Figure 3:
Figure 3:
Figure 3:

FIG. 3 depicts a timing diagram illustrating the operation of memory system 42 depicted in FIG. 2. FIG. 3 depicts the various relationships among a periodic clock signal CLOCK, the input ADDRESS, the control signals WL, LE, and PRECHARGE, and the output DATA in a read operation. Memory system 42 performs a single cycle read operation, straddling two separate clock cycles. At the beginning of a read operation, the control signals LE and PRECHARGE are and have been de-asserted, respectively, precharging the inputs to inverters 28 and 30 and the bitlines. Initially, an address is presented to one-of-N decoder 46 in the second phase of the first clock cycle. One-of-N decoder 46 asserts one WL signal selecting a particular row of bit cells 44 corresponding to the input address. One-of-N decoder 46 de-asserts the one WL signal part way through the first phase of the following clock cycle. The logic level(s) stored in the selected bit cell(s) will begin to separate the voltage(s) on the corresponding bitline(s) and bitline(s) bar. The control signal LE transitions to a high logic state at the beginning of the second clock cycle for the duration of the cycle's first phase. Sense amp 10 outputs a logic level signal corresponding to the stored data shortly thereafter. The control signal LE is de-asserted at the end of the first phase of the second clock signal. Also, the control signal PRECHARGE is asserted during the latter half of the first phase of the second clock signal. As described above, the control signal PRECHARGE prepares memory system 42 for the following clock cycle by precharging the bitlines and bitlines bar. The control signal PRECHARGE may be asserted before the data is available at the outputs of sense amp 10 to improve the performance of memory system 42.

In a write operation, the bitlines are forced to a full voltage supply differential when the wordline is asserted. Sense amp 10 need not be enabled.

Although the present invention has been described with reference to a specific embodiment, further modifications and improvements will occur to those skilled in the art. For instance, sense amp 10 may be implemented with p-channel transistors where FIG. 1 depicts n-channel transistors and vice versa with appropriate modifications to the timing signals. It is to be understood that the invention encompasses all such modifications and embodiments that do not depart from the spirit and scope of the invention as defined in the appended claims.

We claim:

1. A sense amplifier comprising:

a first transistor (12) comprising a first current electrode, a second current electrode and a control electrode, the first current electrode thereof receiving a first voltage supply, an output signal being produced at the second current electrode thereof;

a second transistor (16) comprising a first current electrode, a second current electrode and a control electrode, the first current electrode thereof coupled to the second current electrode of the first transistor;

a third transistor (20) comprising a first current electrode, a second current electrode and a control electrode, the first current electrode thereof coupled to the second current electrode of the second transistor, the control electrode receiving a first input voltage to be sensed;

a fourth transistor (14) comprising a first current electrode, a second current electrode and a control electrode, a logical complement of the output signal being produced at the second current electrode thereof, the first current electrode thereof receiving the first voltage supply, the second current electrode thereof coupled to the control electrode of the first transistor and to the control electrode of the second transistor, the control electrode thereof coupled to the second current electrode of the first transistor;

a fifth transistor (18) comprising a first current electrode, a second current electrode and a control electrode, the first current electrode thereof coupled to the second current electrode of the fourth transistor, the control electrode thereof coupled to the second current electrode of the first transistor;

a sixth transistor (22) comprising a first current electrode, a second current electrode and a control electrode, the first current electrode thereof coupled to the second current electrode of the fifth transistor, the control electrode thereof receiving a second input voltage to be sensed;

a seventh transistor (24) comprising a first current electrode, a second current electrode and a control electrode, the first current electrode thereof coupled to the second current electrode of the third transistor and to the second current electrode of the sixth transistor, the second current electrode thereof receiving a second voltage supply, the control electrode thereof receiving an enabling control signal;

an equalization circuit coupled to the second current electrode of the first transistor and to the second current electrode of the fourth transistor, the equalization circuit coupling a predetermined voltage level to the second current electrode of the first transistor and to the second current electrode of the fourth transistor responsive to the enabling control signal; and an eighth transistor comprising a first current electrode, a second current electrode and a control electrode, the first current electrode thereof coupled to the second current electrode of the third transistor and to the second current electrode of the sixth transistor, the second current electrode thereof receiving the second voltage supply, the control electrode receiving the first voltage supply.

2. The sense amplifier of claim 1 wherein the equalization circuit comprises:

a first transistor comprising a first current electrode, a second current electrode and a control electrode, the first current electrode thereof receiving the first voltage supply, the second current electrode thereof coupled to the second current electrode of the first transistor, the control electrode receiving the enabling control signal; and a second transistor comprising a first current electrode, a second current electrode and a control electrode, the first current electrode thereof receiving the first voltage supply, the second current electrode thereof coupled to the second current electrode of the fourth transistor, the control electrode thereof receiving the enabling control signal.

3. A system comprising:

a plurality of memory bit cells each generating a voltage differential across a first bitline and a second bitline, one of the plurality of memory bit cells generating the voltage differential responsive to an assertion of one of a plurality of wordline signals;

a decode circuit asserting or de-asserting each one of the plurality of wordline signals as a function of an input address;

a sense amplifier comprising:
a first transistor comprising a first current electrode, a second current electrode and a control electrode, the first current electrode thereof receiving a first voltage supply, an output signal being produced at the second current electrode thereof;

a second transistor comprising a first current electrode, a second current electrode and a control electrode, the first current electrode thereof coupled to the second current electrode of the first transistor;

a third transistor comprising a first current electrode, a second current electrode and a control electrode, the first current electrode thereof coupled to the second current electrode of the second transistor, the control electrode coupled to the first bitline;

a fourth transistor comprising a first current electrode, a second current electrode and a control electrode, a logical complement of the output signal being produced at second current electrode thereof, the first current electrode thereof receiving the first voltage supply, the second current electrode thereof coupled to the control electrode of the first transistor and to the control electrode of the second transistor, the control electrode thereof coupled to the second current electrode of the first transistor;

a fifth transistor comprising a first current electrode, a second current electrode and a control electrode, the first current electrode thereof coupled to the second current electrode of the fourth transistor, the control electrode thereof coupled to the second current electrode of the first transistor;

a sixth transistor comprising a first current electrode, a second current electrode and a control electrode, the first current electrode thereof coupled to the second current electrode of the fifth transistor, the control electrode thereof coupled to the second bitline;

a seventh transistor comprising a first current electrode, a second current electrode and control electrode, the first current electrode thereof coupled to the second current electrode of the third transistor and to the second current electrode of the sixth transistor, the second current electrode there receiving a second voltage supply, the control electrode thereof receiving an enabling control signal; and an equalization circuit coupled to the second current electrode of the first transistor and to the second current electrode of the fourth transistor, the equalization circuit coupling a predetermined voltage level to the second current electrode of the first transistor and to the second current electrode of the fourth transistor responsive to the enabling control signal; and an eighth transistor comprising a first current electrode, a second current electrode and a control electrode, the first current electrode thereof coupled to the second current electrode of the third transistor and to the second current electrode of the sixth transistor, the second current electrode thereof receiving the first voltage supply.

4. The system of claim 3 wherein the equalization circuit comprises:

a first transistor comprising a first current electrode, a second current electrode and a control electrode, the first current electrode thereof receiving the first voltage supply, the second current electrode thereof coupled to the second current electrode of the first transistor, the control electrode receiving the enabling control signal; and a second transistor comprising a first current electrode, a second current electrode and a control electrode, the first current electrode thereof receiving the first voltage supply, the second current electrode thereof coupled to the second current electrode of the fourth transistor, the control electrode thereof receiving the enabling control signal.

\* \* \* \* \*